United States Patent
Xie et al.

(10) Patent No.: US 11,688,646 B2
(45) Date of Patent: Jun. 27, 2023

(54) REDUCED SOURCE/DRAIN COUPLING FOR CFET

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Chanro Park, Clifton Park, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 17/395,611

(22) Filed: Aug. 6, 2021

(65) Prior Publication Data

US 2021/0366782 A1    Nov. 25, 2021

Related U.S. Application Data

(62) Division of application No. 16/826,879, filed on Mar. 23, 2020, now Pat. No. 11,164,793.

(51) Int. Cl.
*H01L 21/8238* (2006.01)
*H01L 27/092* (2006.01)
*H01L 29/06* (2006.01)

(52) U.S. Cl.
CPC ............ *H01L 21/823807* (2013.01); *H01L 21/823857* (2013.01); *H01L 21/823878* (2013.01); *H01L 27/092* (2013.01); *H01L 29/0649* (2013.01)

(58) Field of Classification Search
CPC ..... H01L 21/823807; H01L 21/823857; H01L 21/823878; H01L 21/8221; H01L 21/823814; H01L 27/092; H01L 27/0688; H01L 29/0649; H01L 29/0653; H01L 29/0673; H01L 29/66439; H01L 29/775
See application file for complete search history.

(56) References Cited

U.S. PATENT DOCUMENTS 9,905,643 B1    2/2018   Bergendahl et al.
10,026,652 B2   7/2018   Wang et al.
10,192,819 B1   1/2019   Chanemougame et al.
(Continued)

FOREIGN PATENT DOCUMENTS

JP    2018506861 A    3/2018

OTHER PUBLICATIONS

List of IBM Patents or Patent Applications Treated as Related dated Aug. 6, 2021, 2 pages.
(Continued)

*Primary Examiner* — Dao H Nguyen
(74) *Attorney, Agent, or Firm* — Tutunjian & Bitetto, P.C.; Jeffrey S. LaBaw (57) ABSTRACT

A method is presented for reducing capacitance coupling. The method includes forming a nanosheet stack including alternating layers of a first material and a second material over a substrate, forming a source/drain epi for a first device, depositing a sacrificial material over the source/drain epi, forming a source/drain epi for a second device over the sacrificial material, and removing the sacrificial material to define an airgap directly between the source/drain epi for the first device and the source/drain epi for the second device.

19 Claims, 11 Drawing Sheets

(56) References Cited

U.S. PATENT DOCUMENTS

| | | | |
|---|---|---|---|
| 10,192,867 B1 | 1/2019 | Frougier et al. | |
| 10,243,043 B2 | 3/2019 | Mochizuki et al. | |
| 10,256,158 B1* | 4/2019 | Frougier | H01L 29/161 |
| 2013/0320459 A1* | 12/2013 | Shue | H01L 21/76283 |
| | | | 438/296 |
| 2017/0309719 A1 | 10/2017 | Sun et al. | |
| 2018/0301564 A1 | 10/2018 | Kwon et al. | |
| 2019/0148215 A1* | 5/2019 | Chang | H01L 29/66545 |
| | | | 257/369 |
| 2019/0157414 A1 | 5/2019 | Ando et al. | |
| 2019/0326286 A1* | 10/2019 | Xie | H01L 29/401 |
| 2019/0378903 A1* | 12/2019 | Jeon | H01L 21/823431 |
| 2021/0098309 A1* | 4/2021 | Min | H01L 21/764 |

OTHER PUBLICATIONS

Ryckaert et al., "The Complementary FET (CFET) for CMOS scaling beyond N3", 2018 IEEE Symposium on VLSI Technology Digest of Technical Paper. Jun. 18, 2018. pp. 141-142.

\* cited by examiner

REDUCED SOURCE/DRAIN COUPLING FOR CFET

BACKGROUND

The present invention relates generally to semiconductor devices, and more specifically, to reduced source/drain coupling for a complementary field effect transistor (CFET).

Slated for 2.5 nm and beyond, a CFET is a more complex version of a gate-all-around device. Traditional gate-all-around field effect transistors (FETs) stack several p-type wires on top of each other. In a separate device, the transistor stacks n-type wires on each other. In CFETs, the idea is to stack both nFET and pFET wires on each other. A CFET can stack one nFET on top of a pFET wire, or two nFETs on top of two pFET wires. Since a CFET stacks both n- and p-type devices on each other, the transistor provides benefits related to area.

SUMMARY

In accordance with an embodiment, a method is provided for reducing capacitance coupling. The method includes forming a nanosheet stack including alternating layers of a first material and a second material over a substrate, forming a source/drain epi for a first device, depositing a sacrificial material over the source/drain epi, forming a source/drain epi for a second device over the sacrificial material, and removing the sacrificial material to define an airgap directly between the source/drain epi for the first device and the source/drain epi for the second device.

In accordance with another embodiment, a method is provided for reducing capacitance coupling. The method includes forming a nanosheet stack including alternating layers of a first material and a second material over a substrate, forming a dummy gate over the nanosheet stack, selectively etching one layer of the alternating layers to define a gap within the nanosheet stack, filling the gap with a first spacer material, recessing the nanosheet stack and etching the first material of the alternating layers to create a plurality of nanosheet stacks and indentations within each of the plurality of nanosheet stacks, filling the indentations with a second spacer material, forming a source/drain epi for a first device between the plurality of nanosheet stacks, depositing a sacrificial material over the source/drain epi, forming a source/drain epi for a second device over the sacrificial material, and removing the sacrificial material to define an airgap directly between the source/drain epi for the first device and the source/drain epi for the second device.

In accordance with yet another embodiment, a complementary field effect transistor (CFET) is provided. The CFET includes an nFET channel device and a pFET channel device and an airgap defined directly between the nFET channel device and the pFET channel device.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for reducing capacitance coupling by forming an airgap between a p-type field effect transistor (pFET) epi and an n-type field effect transistor (nFET) epi. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

During the replacement metal gate (RMG) process, the sacrificial material is removed and the wide fin is split into channel fins. The fin structure is a CFET. A CFET is a more complex gate-all-around technology, where the process stacks n-type field effect transistor (nFET) and p-type field effect transistor (pFET) wires on top of each other. The current gate-all-around devices stack one type of wire, whether it is nFET or pFET, on top of each other. In other words, the CFET is a further development of the stacked gate all around (GAA) nanowire form of transistor but one in which either n- or p-type GAAs are stacked above the other type so that two transistors occupy the space of one and complementary metal oxide semiconductor (CMOS) logic circuitry can be supported efficiently. However, when constructing CFETs devices, capacitance coupling can be too large, thus potentially leading to false turn-on or read/write disturb in SRAM affecting stability.

Embodiments in accordance with the present invention provide methods and devices for overcoming capacitance coupling issues by forming a nanosheet structure with a pFET device and an nFET device separated by an airgap. The methods and structures enable the reduction of top/bottom source/drain (S/D) epi coupling by forming an airgap directly between top S/D and bottom S/D for a CFET device.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
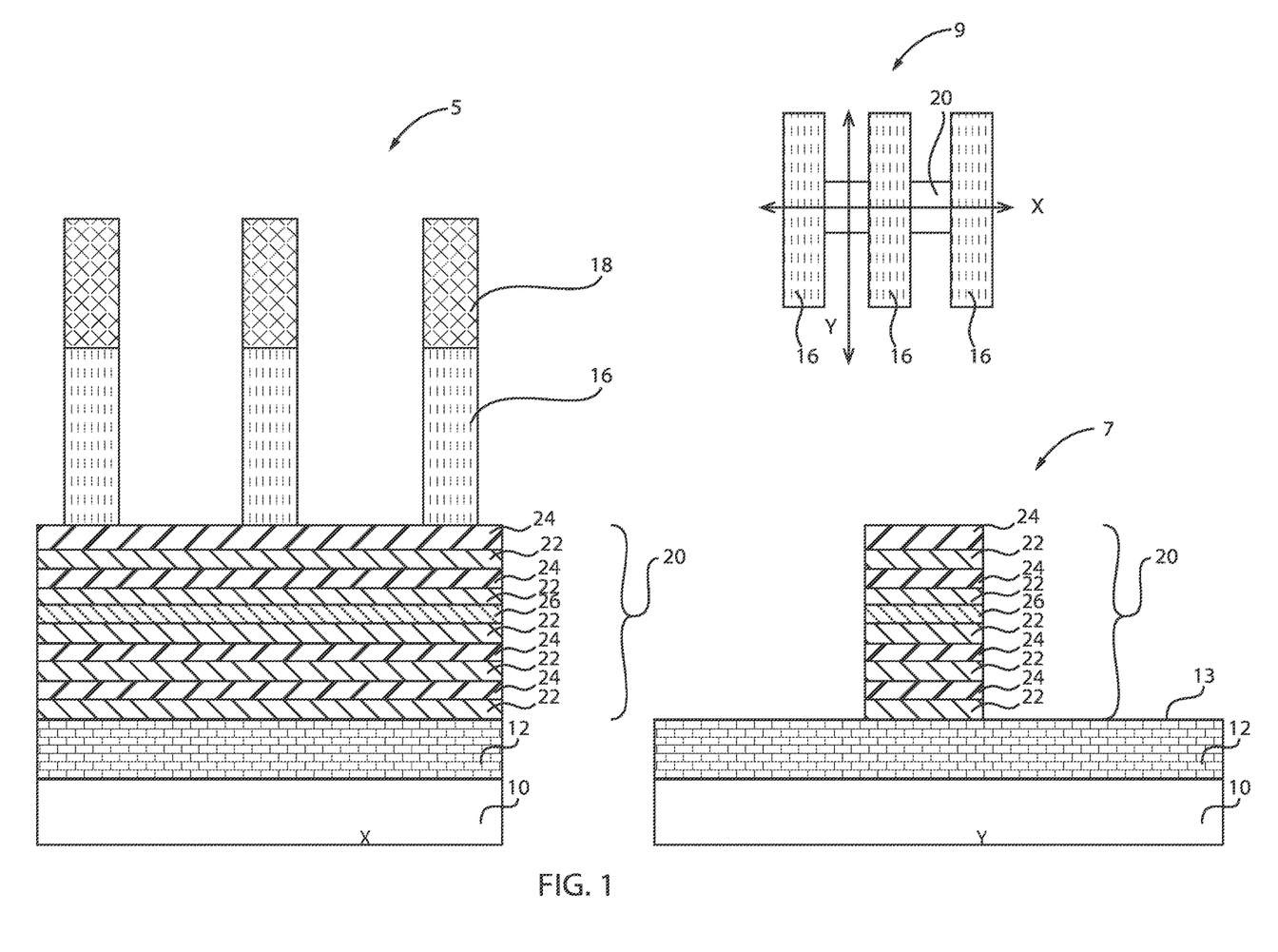
FIG. 1 is a cross-sectional view of a semiconductor structure including a nanosheet stack formed over a substrate, where a dummy gate and hardmask are formed over the nanosheet stack, in accordance with an embodiment of the present invention.

FIG. 1 is a cross-sectional view of a semiconductor structure including a nanosheet stack formed over a substrate, where a dummy gate and hardmask are formed over the nanosheet stack, in accordance with an embodiment of the present invention.

In various example embodiments, a semiconductor structure 5 includes a dielectric layer 12 formed over a substrate 10. Multiple field effect transistor (FET) devices can be formed over the substrate 10. In one example, a single FET device can be formed over the substrate 10. The FET device can be formed by constructing a nanosheet stack 20.

The nanosheet stack 20 of structure 5 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si). The nanosheet stack 20 also includes a semiconductor layer 26, which is a SiGe layer. Semiconductor layers 22 are 30% Ge content SiGe layers, whereas semiconductor layer 26 is a 65% Ge content SiGe layer. Semiconductor layer 26 can be centrally located within the nanosheet stack 20.

Structure 5 is a cross-sectional view along line X of top view 9.

Structure 7 is a cross-sectional view along line Y of top view 9. In structure 7, a top surface 13 of the dielectric layer 12 is exposed.

Structure 9 illustrates a top view where the dummy gate 16 is formed over the nanosheet stack 20.

A dummy gate 16 and hardmask 18 are formed over the nanosheet stack 20.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Non-limiting examples of suitable dielectric materials 12 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

The hardmask layer 18 can be a nitride, for example, a silicon nitride (SiN), an oxynitride, for example, silicon oxynitride (SiON), or a combination thereof. In one embodiment, the hardmask layer 18 can be silicon nitride (SiN), for example, $Si_3N_4$.

Referring to, e.g., the nanosheet stack 20, the first semiconductor layer 22 can be the first layer in a stack of sheets of alternating materials. The first nanosheet stack 20 includes first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
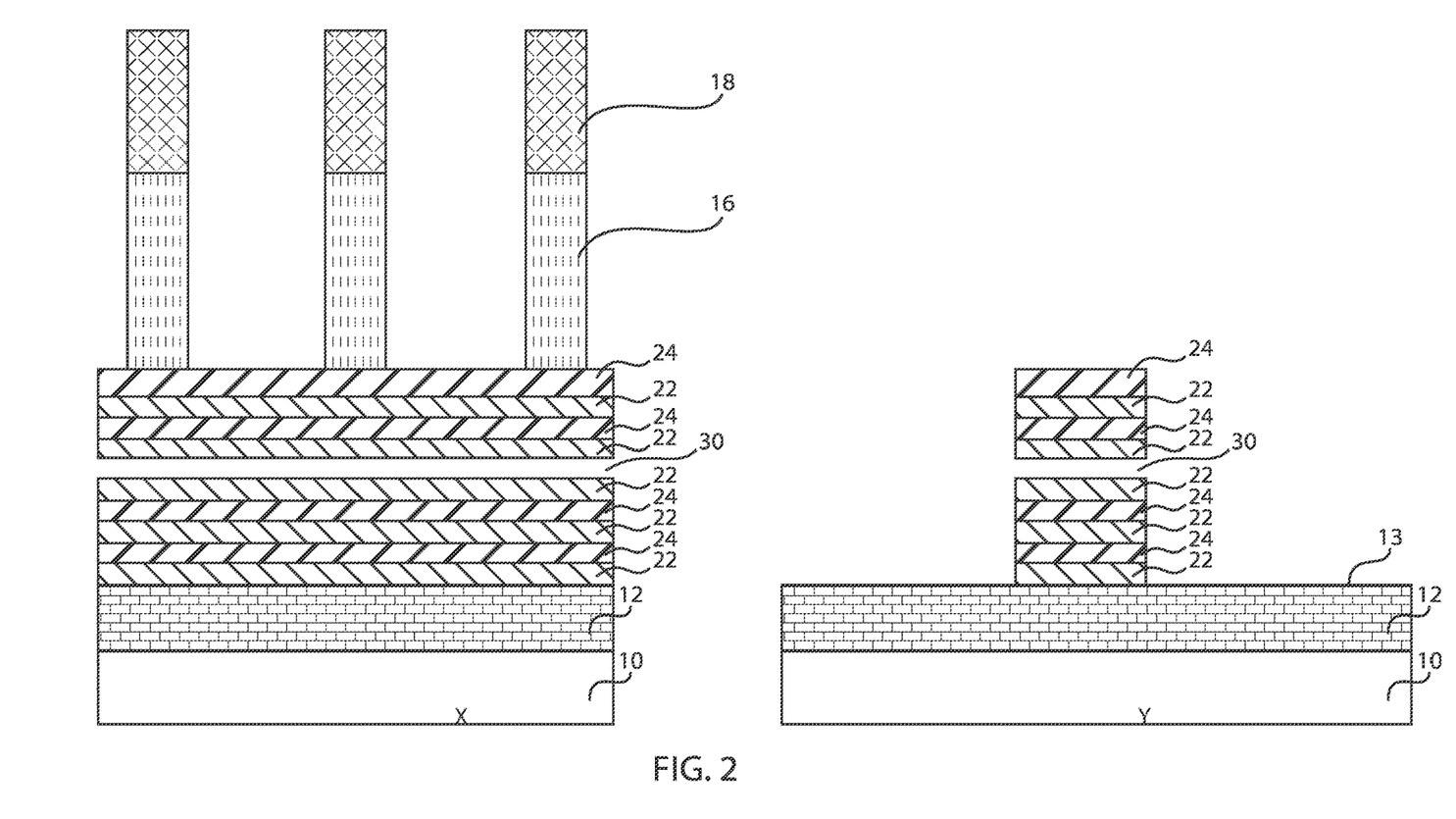
FIG. 2 is a cross-sectional view of the semiconductor structure of FIG. 1 where a semiconductor layer of the nanosheet stack is selectively removed, in accordance with an embodiment of the present invention.

FIG. 2 is a cross-sectional view of the semiconductor structure of FIG. 1 where a semiconductor layer of the nanosheet stack is selectively removed, in accordance with an embodiment of the present invention.

In various example embodiments, semiconductor layer 26 of the nanosheet stack is selectively removed to define opening 30 in both X and Y views.

Figure 3:
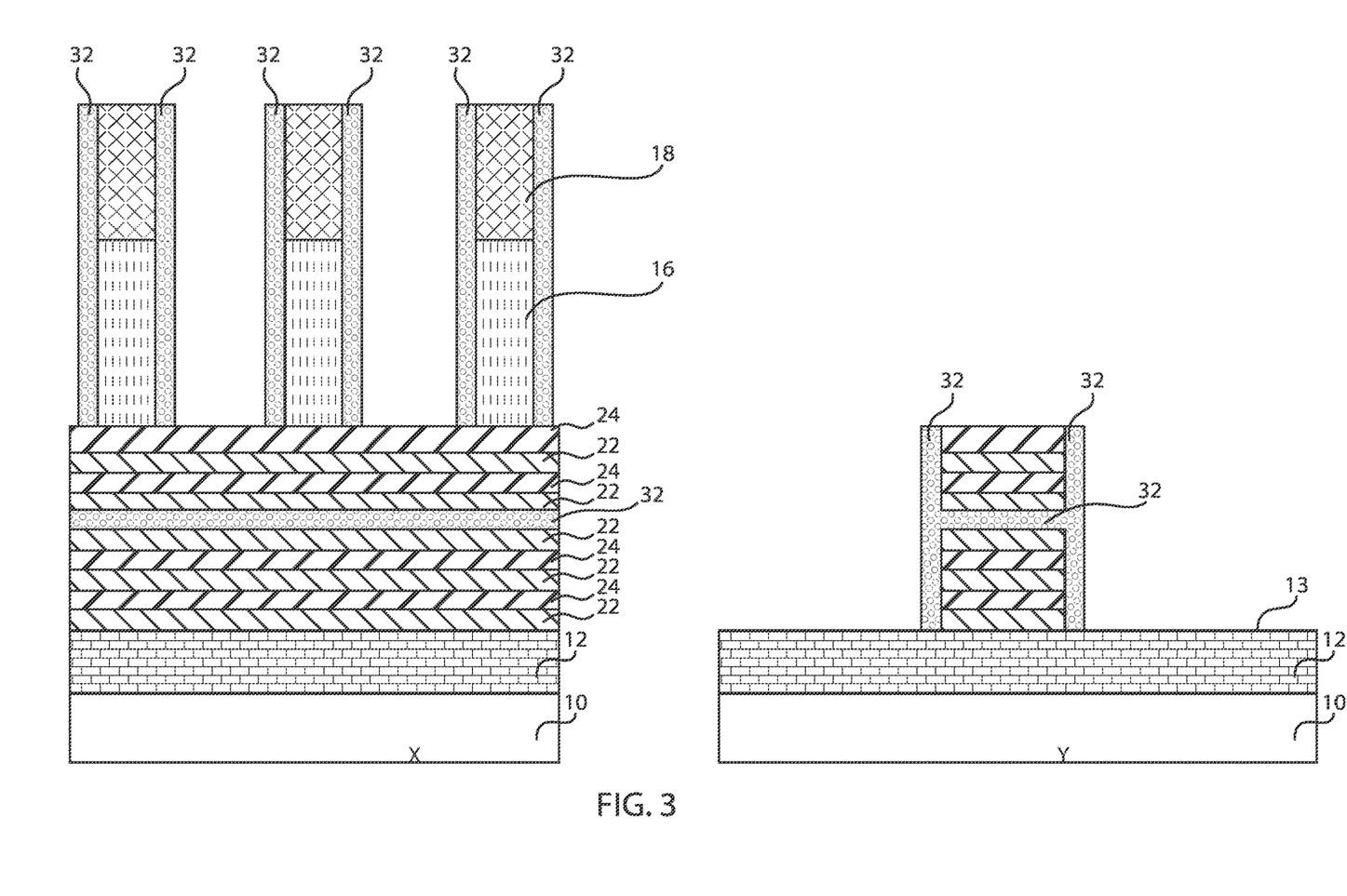
FIG. 3 is a cross-sectional view of the semiconductor structure of FIG. 2 where a spacer is deposited followed by anisotropic spacer RIE, in accordance with an embodiment of the present invention.

FIG. 3 is a cross-sectional view of the semiconductor structure of FIG. 2 where a spacer is deposited followed by anisotropic spacer RIE, in accordance with an embodiment of the present invention.

In various example embodiments, spacers 32 are deposited. The spacers 32 are formed adjacent the dummy gate 16 and the hardmask 18. The spacer 32 also fills the opening 30 in the nanosheet stack 20.

Spacers 32 include an insulating material, for example, silicon dioxide, silicon nitride, SiOCN, or SiBCN. Other non-limiting examples of materials for spacers 32 include oxides (e.g., silicon oxide), dielectric nitrides (e.g., silicon nitride), dielectric oxynitrides, or any combination thereof. The spacers 32 can be formed by a deposition process, for example, atomic layer deposition (ALD), chemical vapor deposition (CVD) or physical vapor deposition (PVD).

Figure 4:
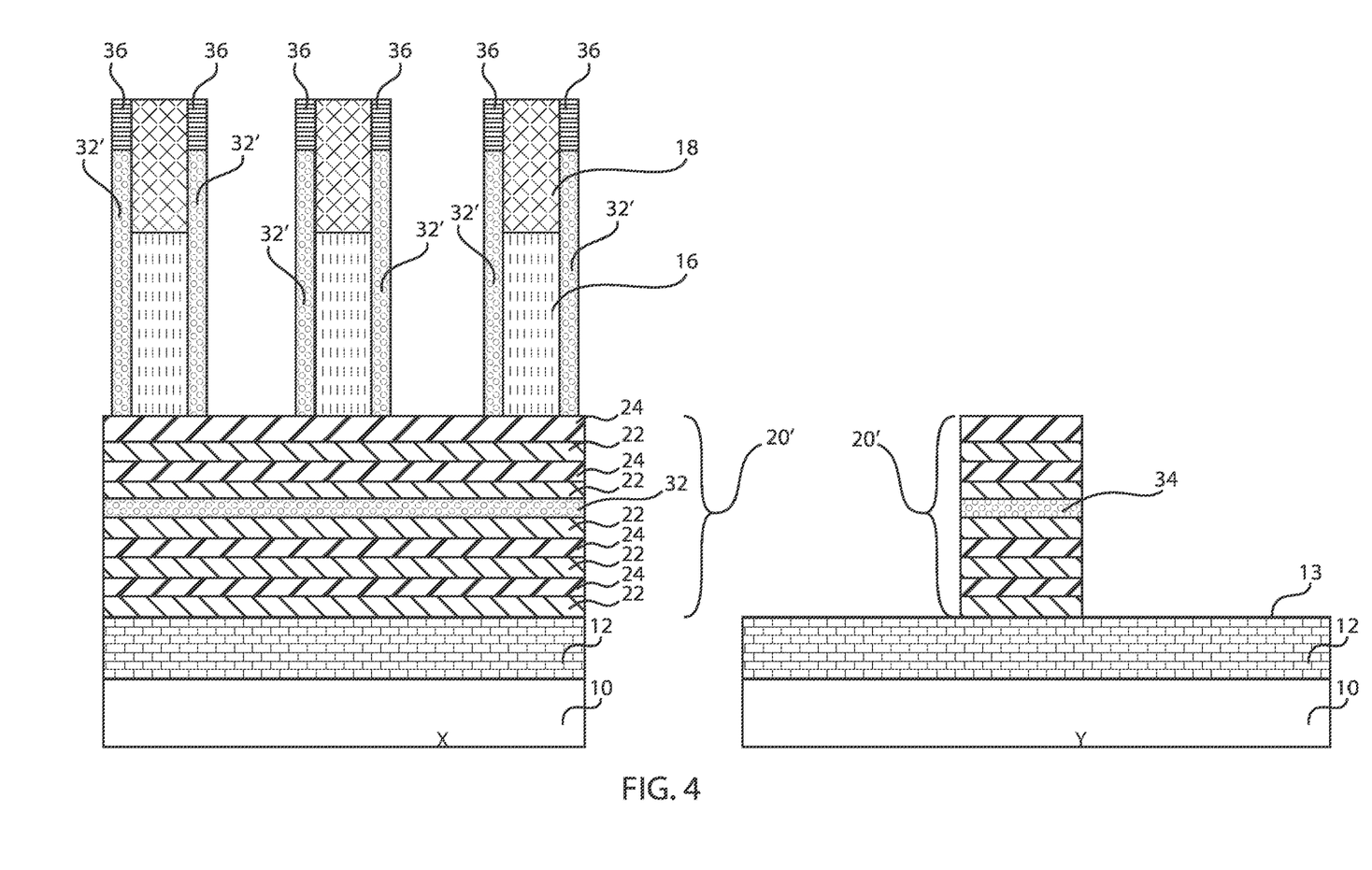
FIG. 4 is a cross-sectional view of the semiconductor structure of FIG. 3 where the spacer is recessed from the source/drain (S/D) side (see in Y-cut) and to protect excessive spacer pull down at gate sidewall (see in X-cut), a spacer cap can be formed, in accordance with an embodiment of the present invention.

FIG. 4 is a cross-sectional view of the semiconductor structure of FIG. 3 where the spacer is recessed from the S/D side (see in Y-cut) and to protect excessive spacer pull down at gate sidewall (see in X-cut), a spacer cap can be formed, in accordance with an embodiment of the present invention.

In various example embodiments, the spacers 32 are recessed and a spacer cap 36 is formed. The recessed spacers are designated as 32'. The spacer cap 36 directly contacts a portion of the sidewalls of the hardmask 18. The spacer cap 36 does not directly contact the dummy gate 16. The nanosheet stack with the remaining spacer material 34 is designated as 20'. In view Y, only spacer material 34 within the nanosheet stack 20' remains.

The spacer cap 36 can be, e.g., silicon dioxide, silicon carbide, etc.

Figure 5:
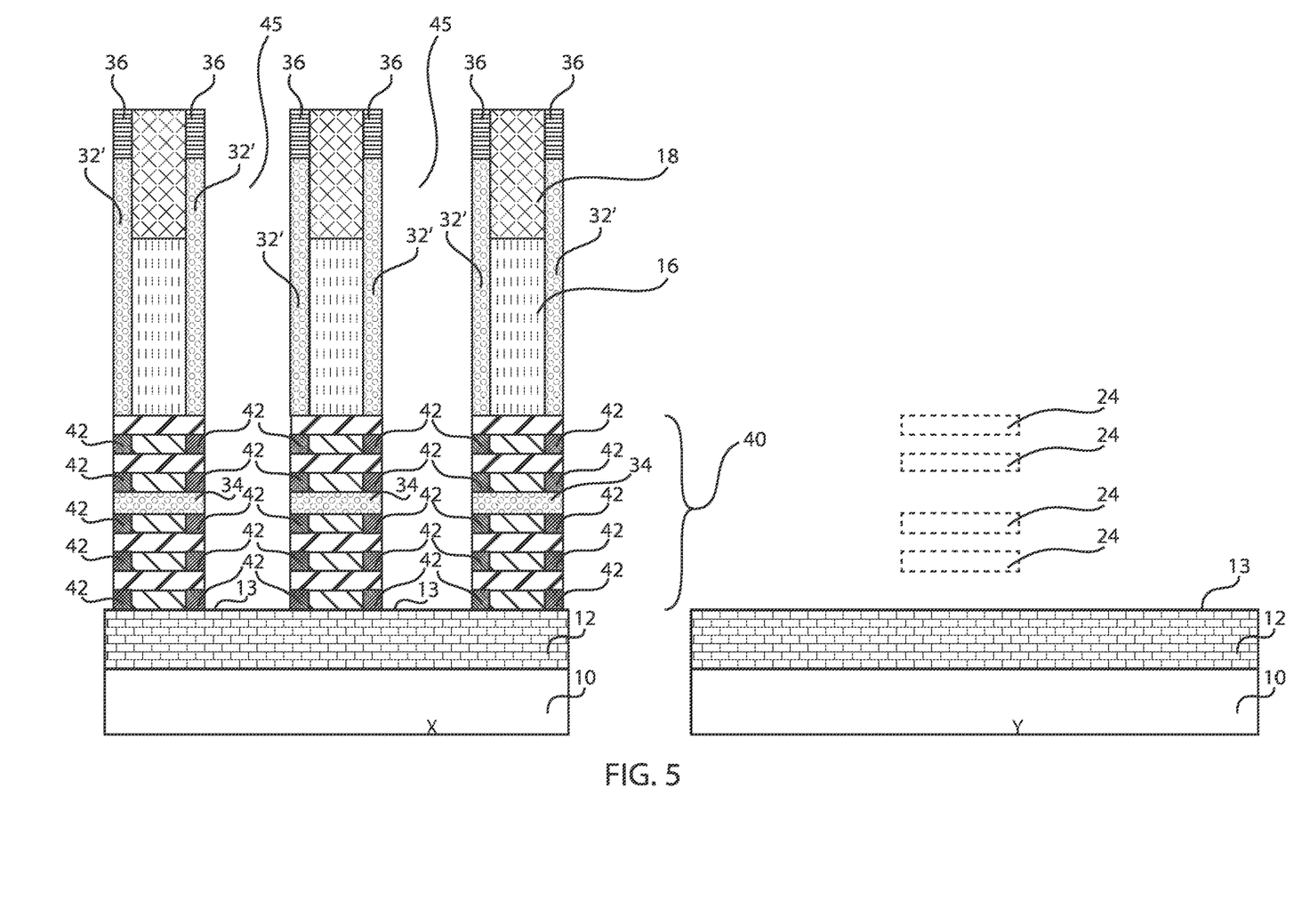
FIG. 5 is a cross-sectional view of the semiconductor structure of FIG. 4 where the nanosheet stack is etched and inner spacers are formed in the indentations of the nanosheet structure, in accordance with an embodiment of the present invention.

FIG. 5 is a cross-sectional view of the semiconductor structure of FIG. 4 where the nanosheet stack is etched and inner spacers are formed in the indentations of the nanosheet structure, in accordance with an embodiment of the present invention.

In various example embodiments, the nanosheet stack 20' is etched, and after that, indentations are formed in the sacrificial SiGe layers, which are filled with an inner spacer 42. The remaining nanosheet stacks are designated as 40. The nanosheet stacks are etched such that a top surface 13 of the dielectric layer 12 is exposed. Opening 45 are defined between the nanosheet stacks 40.

Along the Y-axis, the second semiconductor layers 24 are illustrated as a dotted line because, in the Y-cut, the semiconductor layers 24 do not exist. The dotted line is merely a projection effect to show that channels 24 can be found into the page.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the portions of first semiconductor layer 22 (e.g., the SiGe layer) and leave the entirety or portions of the second semiconductor layer 24. The removal creates gaps or openings or indentations between the second semiconductor layers 24 of the FET device, which are filled with the inner spacers 42.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 6:
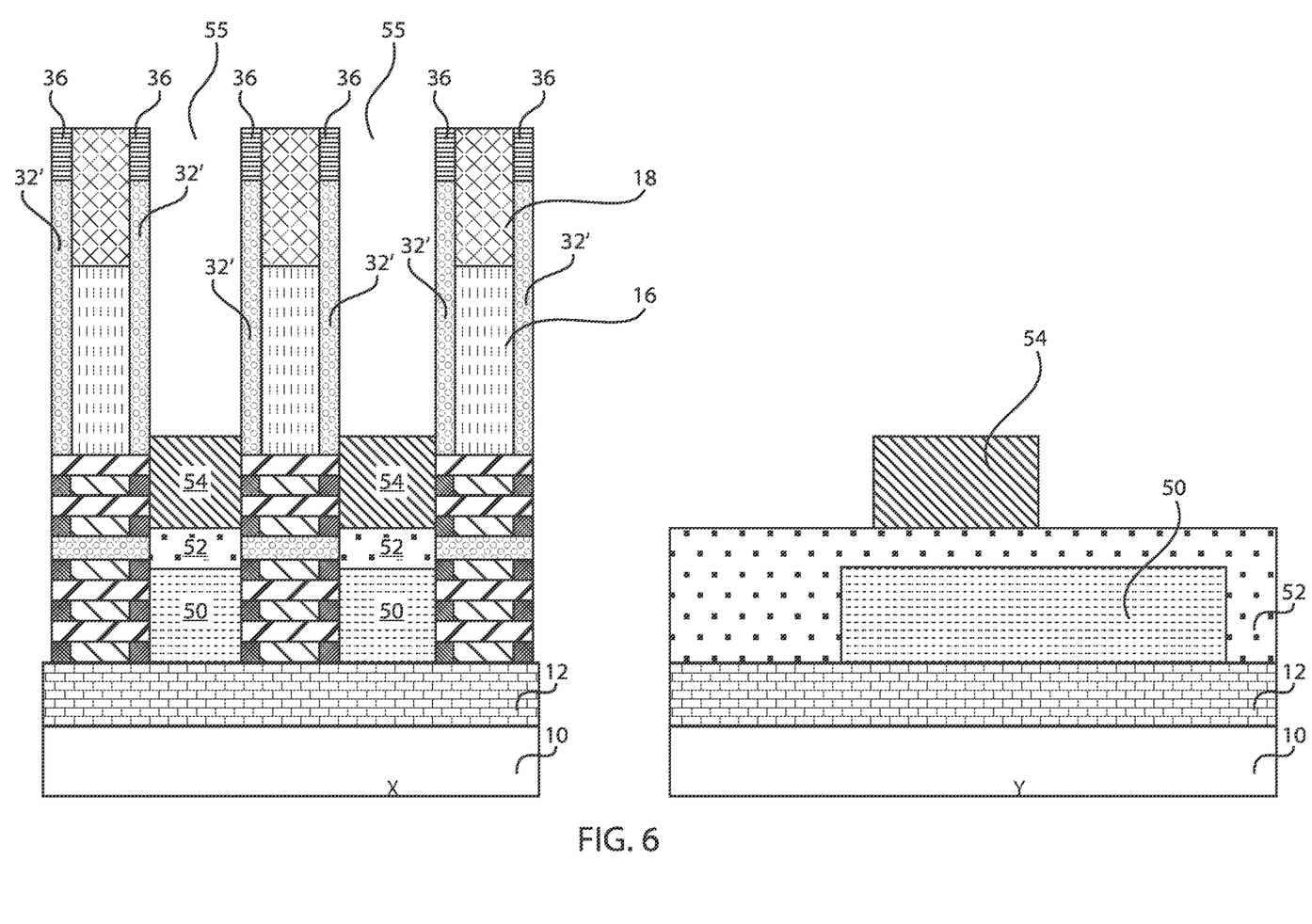
FIG. 6 is a cross-sectional view of the semiconductor structure of FIG. 5 where a pFET epi is formed between the recessed stacks, a sacrificial material is deposited over the pFET epi, and an nFET epi is formed over the sacrificial material, in accordance with an embodiment of the present invention.

FIG. 6 is a cross-sectional view of the semiconductor structure of FIG. 5 where a pFET epi is formed between the recessed stacks, a sacrificial material is deposited over the pFET epi, and an nFET epi is formed over the sacrificial material, in accordance with an embodiment of the present invention.

In various example embodiments, a pFET epi 50 is formed between the recessed stacks 40, a sacrificial material 52 is deposited over the pFET epi 50, and an nFET epi 54 is formed over the sacrificial material 52. The pFET epi 50 can be a first source/drain region and the nFET epi 54 can be a second source/drain region. The pFET epi 50 can be referred to as a pFET channel device and the nFET epi 54 can be referred to as an nFET channel device.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

The sacrificial material 52 can be, for example, amorphous silicon (aSi) or polycrystalline silicon (polysilicon). The sacrificial material 52 can be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Figure 7:
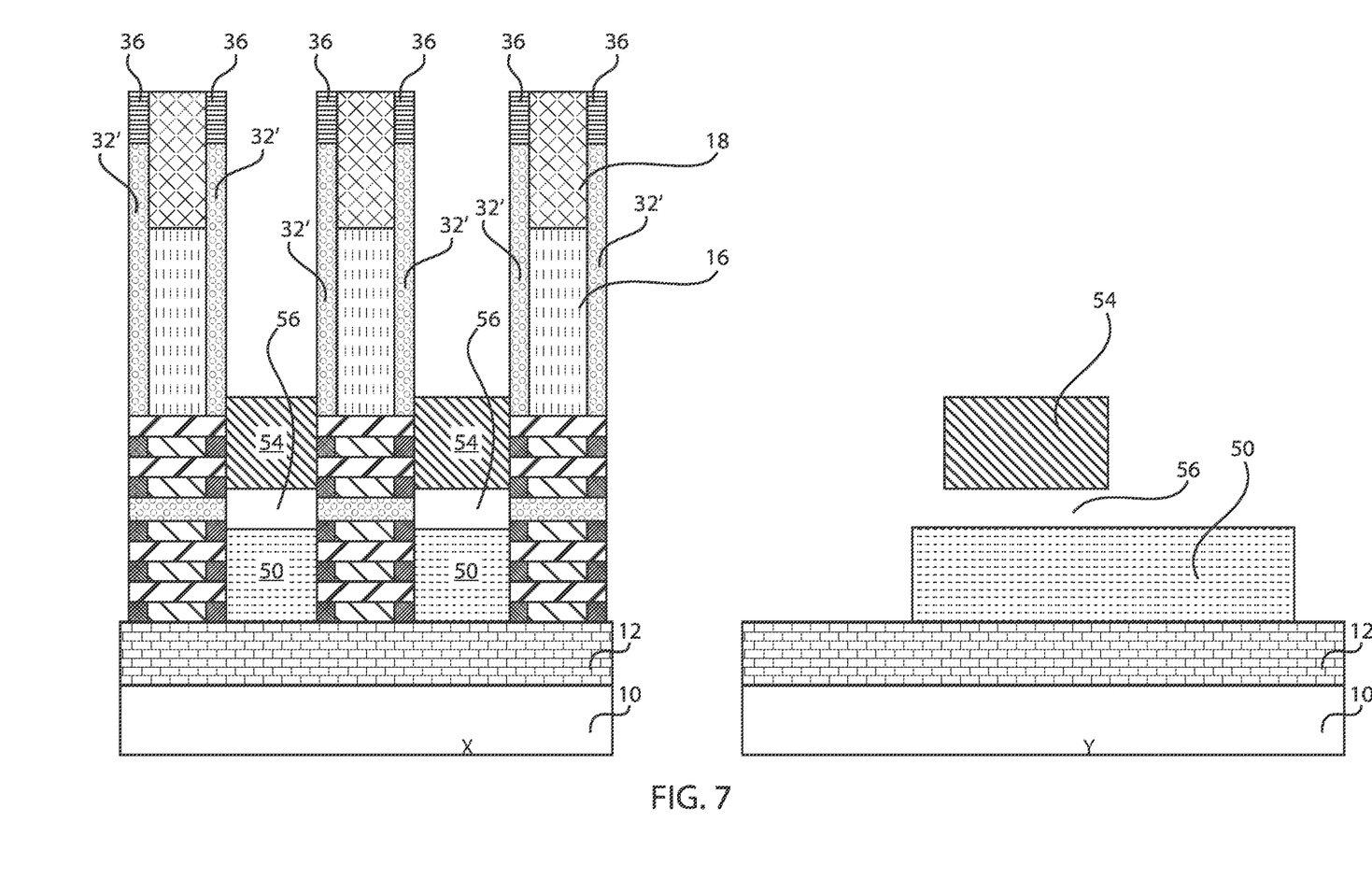
FIG. 7 is a cross-sectional view of the semiconductor structure of FIG. 6 where the sacrificial material is removed, in accordance with an embodiment of the present invention.

FIG. 7 is a cross-sectional view of the semiconductor structure of FIG. 6 where the sacrificial material is removed, in accordance with an embodiment of the present invention.

In various example embodiments, the sacrificial material 52 is removed thus resulting in an airgap 56 formed or defined between the pFET epi 50 and the nFET epi 54.

Figure 8:
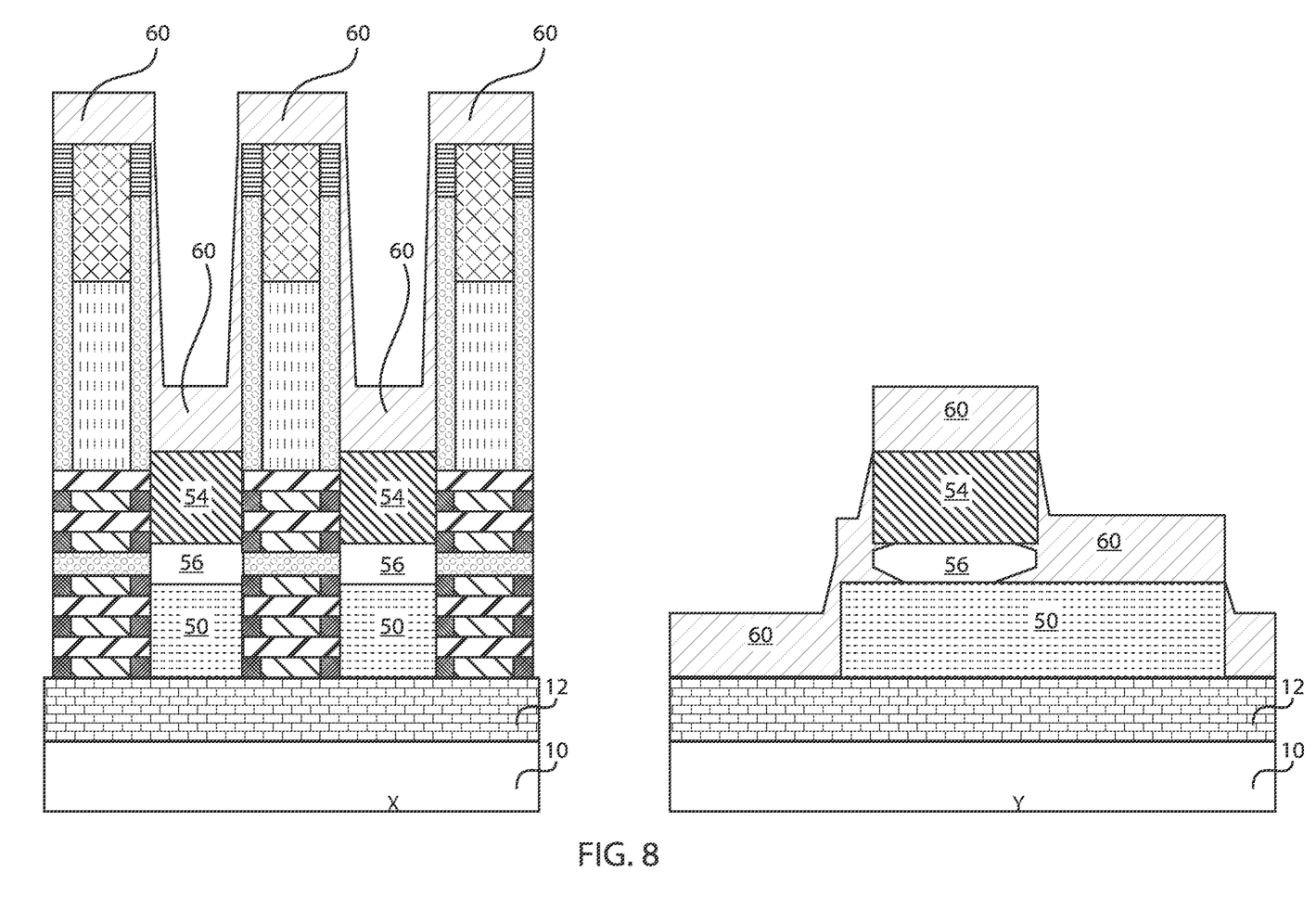
FIG. 8 is a cross-sectional view of the semiconductor structure of FIG. 7 where a directional dielectric deposition takes place, in accordance with an embodiment of the present invention.

FIG. 8 is a cross-sectional view of the semiconductor structure of FIG. 7 where a directional dielectric deposition takes place, in accordance with an embodiment of the present invention.

In various example embodiments, a directional dielectric deposition takes place such that dielectric 60 is formed over the hardmask 18 and over the nFET epi 54, thus defining airgap 56 in view Y.

The dielectric 60 can be, e.g., high-density-plasma (HDP) oxide, HDP nitride or gas cluster ion beam (GCIB) nitride.

Figure 9:
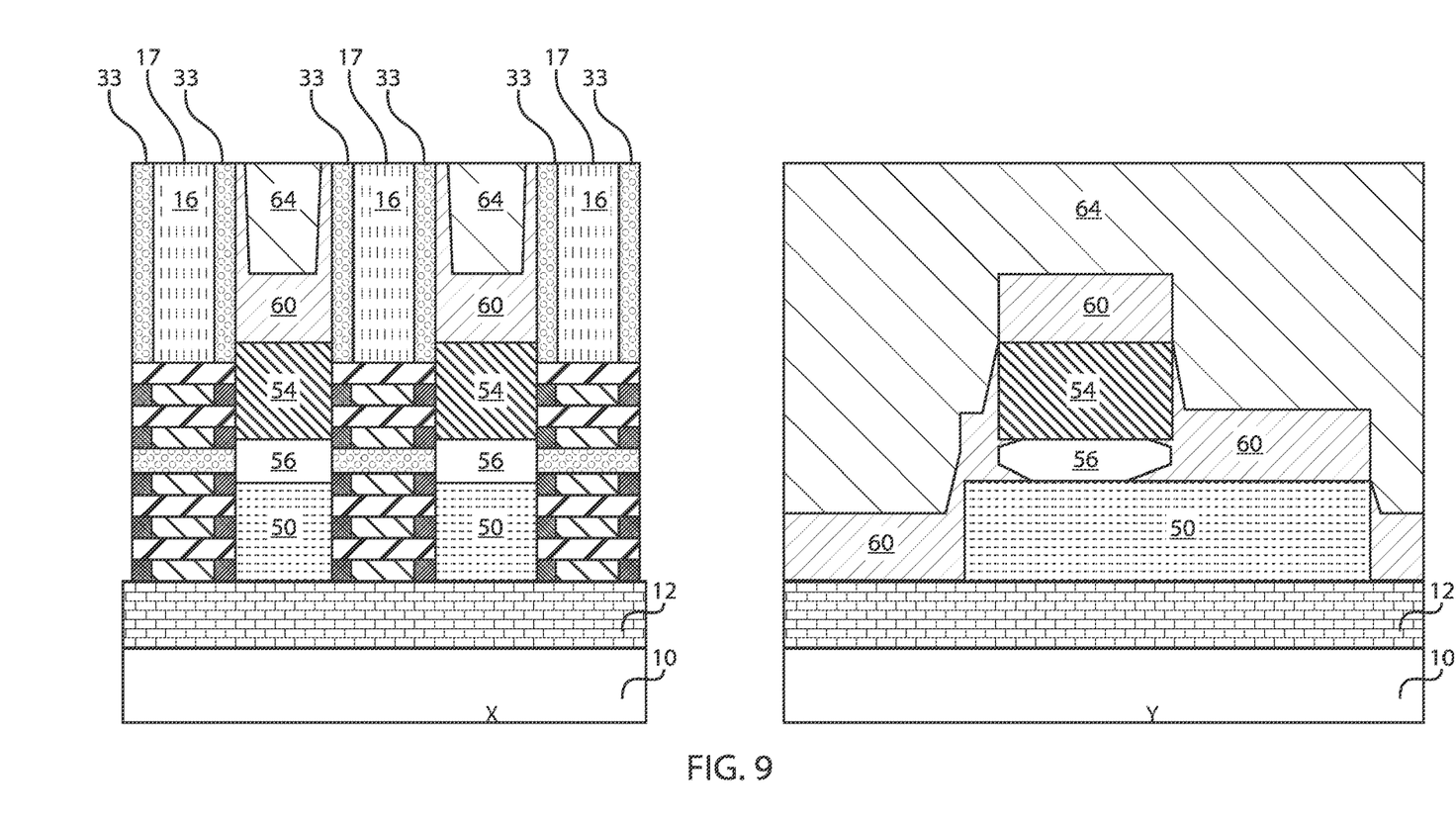
FIG. 9 is a cross-sectional view of the semiconductor structure of FIG. 8 where an inter-layer dielectric (ILD) is deposited and planarized by chemical-mechanical polishing (CMP), in accordance with an embodiment of the present invention.

FIG. 9 is a cross-sectional view of the semiconductor structure of FIG. 8 where an inter-layer dielectric (ILD) is deposited and planarized by chemical-mechanical polishing (CMP), in accordance with an embodiment of the present invention.

In various example embodiments, an inter-layer dielectric (ILD) 64 is deposited and planarized by chemical-mechanical polishing (CMP).

The ILD 64 can be any suitable material, such as, for example, porous silicates, carbon doped oxides, silicon dioxides, silicon nitrides, silicon oxynitrides, or other dielectric materials. Any known manner of forming the ILD 64 can be utilized. The ILD 64 can be formed using, for example, CVD, PECVD, ALD, flowable CVD, spin-on dielectrics, or PVD. In some embodiments, the ILD 64 is planarized to a top surface 17 of the dummy gate 16 and to a top surface 33 of the spacers 32'. The ILD 64 rests within the dielectric 60 in view X. The ILD 64 is vertically aligned with the dielectric 60. The ILD 64 is further vertically aligned with the pFET epi 50 and the nFET epi 54.

Figure 10:
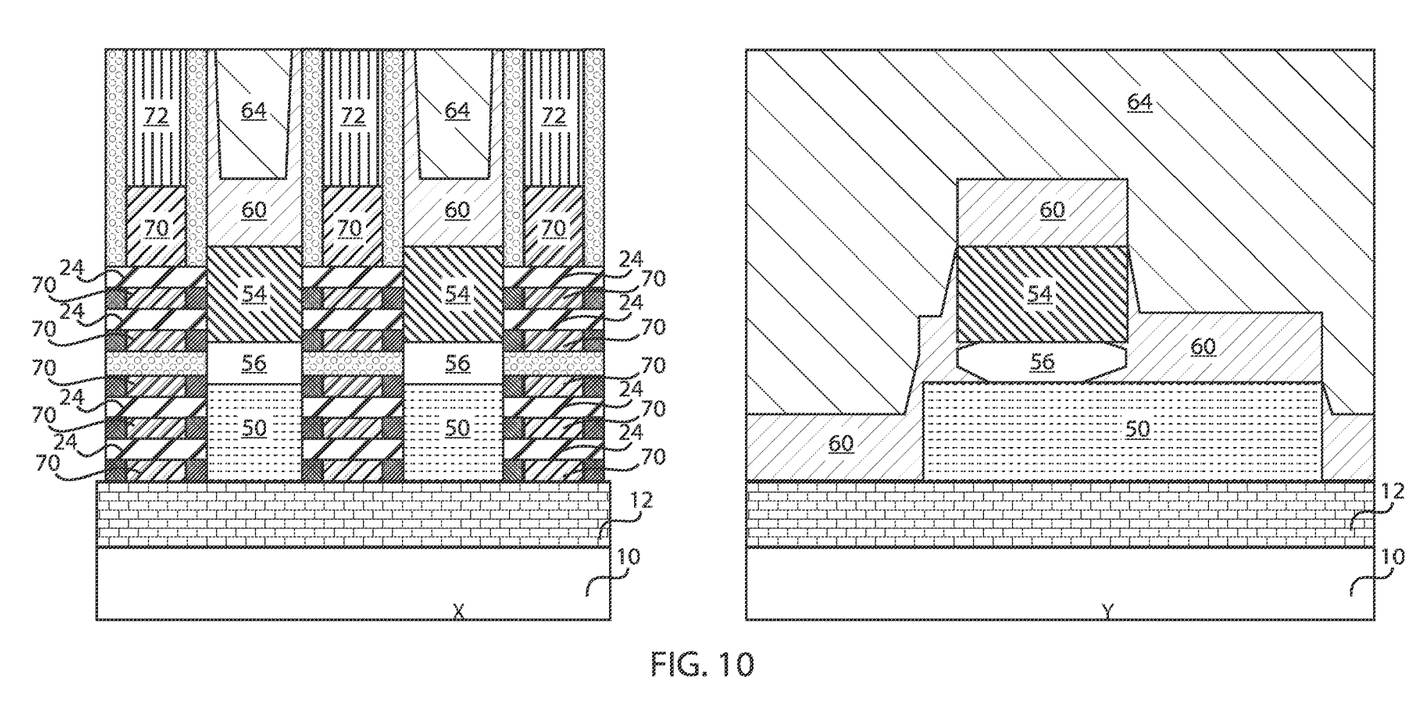
FIG. 10 is a cross-sectional view of the semiconductor structure of FIG. 9 where the dummy gate is removed, the silicon germanium (SiGe) semiconductor layers are released, a high-k metal gate (HKMG) is formed, and a self-aligned contact (SAC) is deposited, in accordance with an embodiment of the present invention.

FIG. 10 is a cross-sectional view of the semiconductor structure of FIG. 9 where the dummy gate is removed, the silicon germanium (SiGe) semiconductor layers are released, a high-k metal gate (HKMG) is formed, and a self-aligned contact (SAC) is deposited, in accordance with an embodiment of the present invention.

In various example embodiments, the dummy gates 16 and the hardmask 18 are removed. Additionally, the semiconductor layers 22 are removed, that is, the SiGe layers 22. The openings are filled with a HKMG 70. A self-aligned contact 72 is deposited over the HKMG 70. The airgaps 56 remain directly between the pFET epi 50 and the nFET epi 54. The airgaps 56 are vertically aligned with the spacer material 34.

The SiGe layers 24 can be removed by using, for example, hydrochloric acid (HCl) gas etch, or wet etches, such as, for example, hydrogen peroxide ($H_2O_2$), especially at higher SiGe concentrations, or SC1 clean (1:1:5 solution of $NH_4OH$ (ammonium hydroxide)+$H_2O_2$ (hydrogen peroxide)+$H_2O$ (water)). In another example embodiment, the etching can be performed by, e.g., wet etch techniques. The selective wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

In various embodiments, the HKMG 70 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Figure 11:
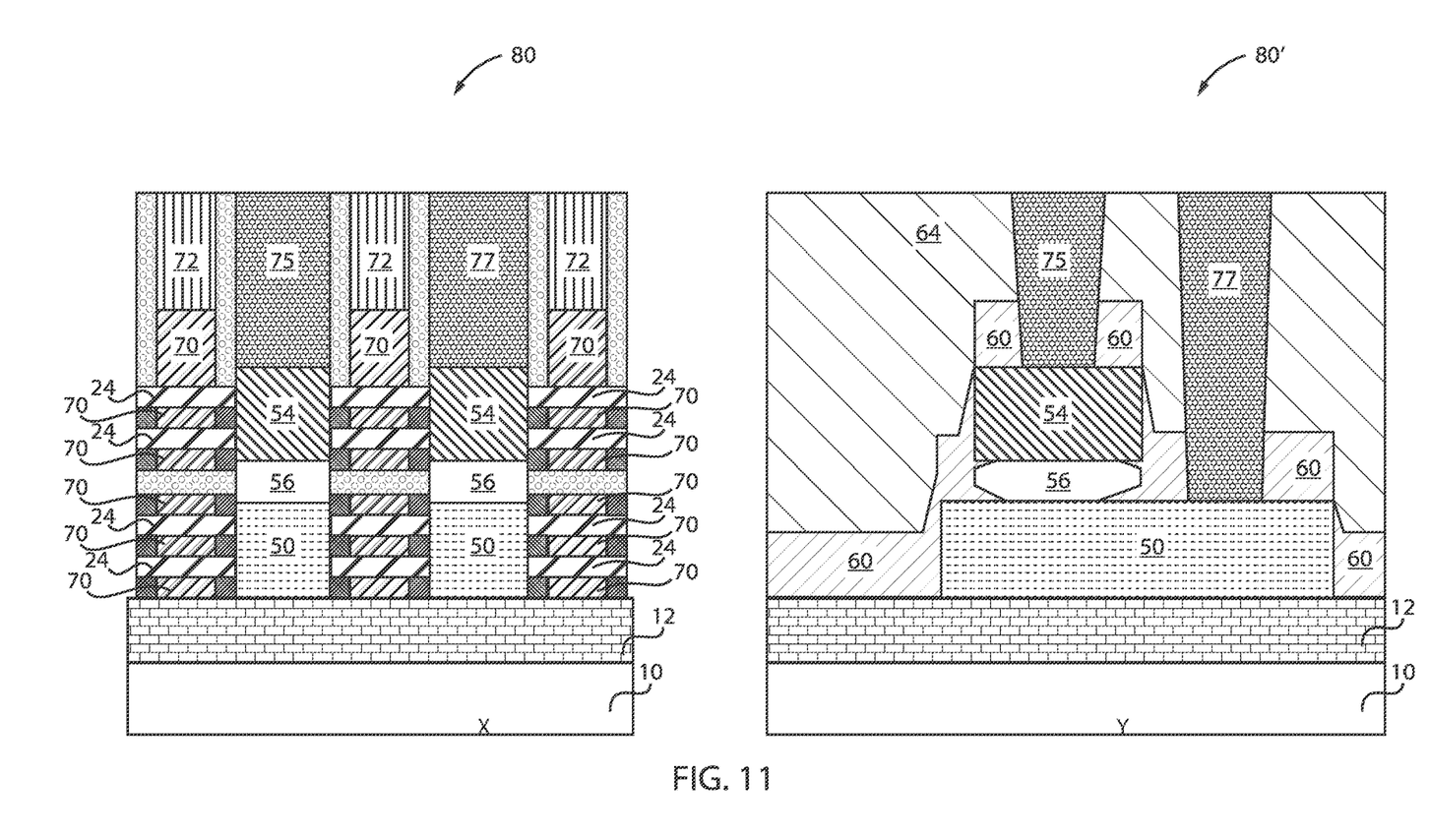
FIG. 11 is a cross-sectional view of the semiconductor structure of FIG. 10 where contact formation takes place, in accordance with an embodiment of the present invention.

FIG. 11 is a cross-sectional view of the semiconductor structure of FIG. 10 where contact formation takes place, in accordance with an embodiment of the present invention.

In various example embodiments, a contact 75 is formed to the nFET epi 54 and a contact 77 is formed to the pFET epi 50. The contacts 75, 77 can be conductive materials.

Structure 80 along axis X and structure 80' along axis Y are illustrated.

Non-limiting examples of suitable conductive materials for contacts 75, 77 include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive metal can be deposited by a suitable deposition process, for example, CVD, PECVD, PVD, plating, thermal or e-beam evaporation, and sputtering.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

A pre-clean wet etch process, such as a buffered hydrofluoric acid (BHF) etch, is a material removal process that uses liquid chemicals or etchants to remove materials from a surface. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and system for reduced source/drain coupling for complementary field effect transistor (CFET) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims:

The invention claimed is:

1. A complementary field effect transistor (CFET) device comprising:
   an nFET channel device and a pFET channel device; and
   an airgap defined directly between the nFET channel device and the pFET channel device such that a width of the airgap is approximately equal to a width of the nFET channel device.

2. The CFET of claim 1, wherein the airgap is horizontally aligned with a dielectric layer.

3. The CFET of claim 2, wherein the airgap is vertically aligned with at least one metal contact.

4. The CFET of claim 3, wherein the nFET channel device and the pFET channel device are disposed between a plurality of nanosheet stacks.

5. The CFET of claim 4, wherein each of the plurality of nanosheet stacks includes alternating layers of a first material and a second material.

6. The CFET of claim 1, wherein a size of the pFET channel device is greater than a size of the nFET channel device.

7. The CFET of claim 1, wherein a dielectric defines sidewall boundaries of the airgap.

8. The CFET of claim 7, wherein the dielectric directly contacts portions of a top surface of the pFET channel device.

9. The CFET of claim 7, wherein the dielectric directly contacts portions of a bottom surface of the nFET channel device.

10. The CFET of claim 1, wherein an upper boundary and a lower boundary of the airgap are defined by a bottom surface of the nFET channel device and a top surface of the pFET channel device, respectively.

11. A complementary field effect transistor (CFET) device comprising:
    an nFET channel device;
    a pFET channel device vertically aligned with the nFET channel device; and
    an airgap defined directly between the nFET channel device and the pFET channel device.

12. The CFET of claim 11, wherein the airgap is horizontally aligned with a dielectric layer.

13. The CFET of claim 12, wherein the airgap is vertically aligned with at least one metal contact.

14. The CFET of claim 13, wherein the nFET channel device and the pFET channel device are disposed between a plurality of nanosheet stacks.

15. The CFET of claim 14, wherein each of the plurality of nanosheet stacks includes alternating layers of a first material and a second material.

16. The CFET of claim 11, wherein a size of the pFET channel device is greater than a size of the nFET channel device.

17. The CFET of claim 11, wherein a width of the airgap is approximately equal to a width of the nFET channel device.

18. The CFET of claim 11, wherein a dielectric defines sidewall boundaries of the airgap.

19. The CFET of claim 11, wherein an upper boundary and a lower boundary of the airgap are defined by a bottom surface of the nFET channel device and a top surface of the pFET channel device, respectively.

* * * * *